United States Patent [19]

Haque

[11] Patent Number: 4,470,126
[45] Date of Patent: Sep. 4, 1984

[54] PROGRAMMABLE TRANSVERSAL FILTER

[75] Inventor: Yusuf A. Haque, San Jose, Calif.

[73] Assignee: American Microsystems, Inc., Santa Clara, Calif.

[21] Appl. No.: 316,183

[22] Filed: Oct. 29, 1981

[51] Int. Cl.³ .............................................. G06G 7/02
[52] U.S. Cl. .................................. 364/825; 364/606; 364/824
[58] Field of Search ............... 364/606, 602, 607, 825, 364/824, 844, 862, 724; 333/165

[56] References Cited

U.S. PATENT DOCUMENTS

| | | | |
|---|---|---|---|
| 3,987,293 | 10/1976 | Crooke et al. | 364/825 |
| 4,012,627 | 3/1977 | Antoniak | 364/607 |
| 4,034,199 | 7/1977 | Lampe et al. | 364/862 |
| 4,063,200 | 12/1977 | Mattern | 364/602 |
| 4,120,035 | 10/1978 | Cases et al. | 364/825 |
| 4,218,752 | 8/1980 | Hewes et al. | 364/825 |
| 4,264,983 | 4/1981 | Miller | 364/825 |
| 4,316,258 | 2/1982 | Berger | 364/602 |
| 4,364,116 | 12/1982 | Nossek | 364/825 |

OTHER PUBLICATIONS

"High Accuracy, Low Glitch Sample-and-Hold Circuit," Clement, Ho, Woodward, IBM Technical Disclosure Bulletin, vol. 22, No. 12, May 1980.
"MOS Sampled-Data High-Pass Filters Using Switched-Capacitor Integrators," Gregorian, Nicholson, Microelectronics Journal, vol. 11, No. 2, 1980, pp. 22-25.
"Analog Current Switch Makes Gain-Programmable Amplifier," Maxwell, Electronics, vol. 50, No. 4, pp. 99, 101, 2-17-77.

Primary Examiner—Jerry Smith
Assistant Examiner—John R. Lastova
Attorney, Agent, or Firm—Steven F. Caserza; Alan H. MacPherson

[57] ABSTRACT

A programmable transversal filter (10) utilizes a plurality of programmable multiplying means ($M_1$–$M_4$). The result of each multiplication is summed by a summing circuit (7), thus providing an output signal (y(t)). The delay network of this invention comprises a plurality of sample and hold circuits ($S_1$–$S_4$) which are selectively connected to the input bus in sequence, in order that one sample and hold circuit may store an analog signal sampled during the present time instant, with other sample and hold circuits storing a plurality of analog signals each of which has been sampled during a corresponding one of a plurality of preceding sample periods.

An analog cross-point switch (51) is utilized wherein each of said plurality of time delayed analog signals may be selectively applied to a selected multiplying means. By utilizing an analog cross-point switch, a transversal filter having programmable tap weights is constructed wherein the tap weights remain fixed in the multipliers until reprogrammed, without the need for rotating the tap weights among the plurality of multipliers. Furthermore, each input voltage sample is stored in a single sample and hold circuit. Because the transversal filter of this invention does not cycle the tap weights among multipliers, the dynamic range of the output signal of the transversal filter constructed in accordance with this invention is increased over that of prior art programmable transversal filters, with a substantial decrease in fixed pattern noise.

6 Claims, 4 Drawing Figures

PROGRAMMABLE TRANSVERSAL FILTER

BACKGROUND OF THE INVENTION

1. Field of the Invention

This invention relates to electronic circuits and, more particularly, to a transversal filter having programmable tap weights.

2. Description of the Prior Art

FIG. 1 shows a block diagram of a transversal filter. An analog input signal X(t) to be filtered is applied to terminal 11-0. This input signal X(t) is multiplied by tap weight $a_0$, and the result of this multiplication is input to summation means 21. The input signal X(t) is also applied to delay means $T_1$, thus providing at time t an output signal X(t−1) on node 11-1. This analog signal X(t−1) is multiplied by tap weight multiplier $a_1$, and the result is applied to summing means 21. The analog signal X(t−1) available on node 11-1 is also applied to delay means $T_2$, thus providing at time t an analog signal X(t−2) on node 11-2. This analog signal X(t−1) is multiplied by tap weight multiplier $a_2$ and the result is applied to summing means 21. In a similar manner, a plurality of N delay means $T_1$ through $T_N$ (where N is selected positive integer) are connected as shown in FIG. 1, with the output signal from each delay means being defined as:

$$V_j(t) = X(t-j) \quad (1)$$

where $V_j(t)$ = the output signal from the jth delay means at time t, where $0 \leq j \leq N$; and $X(t-j)$ = the input signal applied to input terminal 11-0 at time (t−j).

The output signals from each of the N delay means $T_1$ through $T_N$ are multiplied by tap weights $a_1$ through $a_N$, respectively, and the non-delayed input signal X(t) is multiplied by tap weight $a_0$. In this manner, the output signal y(t) on output terminal 12 of summing means 21 is equal to:

$$y(t) = \sum_{j=0}^{N} a_j x(t - j) \quad (2)$$

One such prior art transversal filter is described by Puckette et al. in "Bucket-Brigade Transveral Filters", IEEE Transactions on Communication, Volume COM-22, No. 7, July 1974, pages 926–934. Puckette et al. describe the use of a bucket brigade delay line in a transversal filter. The Puckette approach taps the delay line with source followers, the desired weighting being established by the appropriate choice of capacitance values within each source follower.

Transversal filters have also been implemented utilizing charge-coupled devices (CCDs). Such a CCD transversal filter is described by Brodersen et al. in "A 500-Stage CCD Transversal Filter for Spectral Analysis", IEEE Journal of Solid-State Circuits, Volume SC-11, No. 1, Feb. 1976, pages 75–83. Broderson et al. show that the tap weights are established by the use of appropriate photomasks for forming the electrical interconnects on the device surface. Another prior art CCD transversal filter is described by Baertsch et al. "The Design and Operation of Practical Charge-Transfer Transversal Filters", IEEE Journal of Solid-State Circuits, Volume SC-11, No. 1, Feb. 1976, pages 65–73.

The above-mentioned prior art transversal filters are not programmable in that the tap weight multipliers, once established, may not be altered to provide a different transversal filter characteristic. Attempts have been made to provide a programmable transversal filter. One such attempt is described by White et al. in "CCD and MNOS Devices for Programmable Analog Signal Processing and Digital Non-Volatile Memory", IEEE IEDM, Washington, D.C., 1973, pages 130–133. White et al. utilize a programmable MNOS conductance which is programmed with a train of pulses to adjust the threshold voltage.

Another programmable transversal filter is described by Haque & Copeland in "An Electrically Programmable Transversal Filter", International Electron Devices Meeting, Dec. 1976, pages 27–30. This prior art programmable transversal filter operates by cycling the tap weight coefficients in a digital shift register. However, such a technique results in the generation of fixed pattern noise due to inherent irregularities in the capacitance of the capacitors used to fix the tap weights stored in the digital shift register.

SUMMARY OF THE INVENTION

The programmable transversal filter constructed in accordance with this invention utilizes an analog delay line to provide a plurality of time delayed analog input signals. A plurality of programmable multiplying means are used to multiply each of said time delayed analog signals by a multiplying factor. The result of each mulitplication is summed by a summing circuit, thus providing an output signal from the transversal filter of this invention.

In accordance with this invention, the delay network includes a plurality of sample and hold circuits selectively connected to an input bus to which the analog input signal is applied. The sample and hold circuits are selectively connected to the input bus in sequence, in order that one sample and hold circuit may store an analog signal sampled during the present time instant, with other sample and hold circuits storing a plurality of analog signals each of which has been sampled during a corresponding one of a plurality of preceding sample periods.

Of particular importance in the practice of this invention is the use of an analog cross-point switch, wherein each of said plurality of time delayed analog signals may be selectively applied to a selected multiplying means, thereby providing a desired multiplied analog signal for application to the summing means, in order that the desired filter function may be realized. By utilizing an analog cross-point switch, a transversal filter having programmable tap weights is constructed wherein the tap weights remain fixed in the multipliers until reprogrammed, without the need for rotating the tap weights among the plurality of multipliers. Because the transversal filter of this invention does not cycle the tap weights among multipliers, the dynamic range of the output signal of the transversal filter constructed in accordance with this invention is increased over that of prior art programmable transversal filters, with a substantial decrease in fixed pattern noise. This is achieved by not rotating the tap weights through all multipliers. Rotation of tap weights causes noise, as is described in "Distortion in Rotating Tap Weight Transversal Filters", IEEE Journal of Solid State Circuits, Vol. SC-14, June 1979, pp. 627.

A BRIEF DESCRIPTION OF THE DRAWINGS

DETAILED DESCRIPTION

Figure 2:
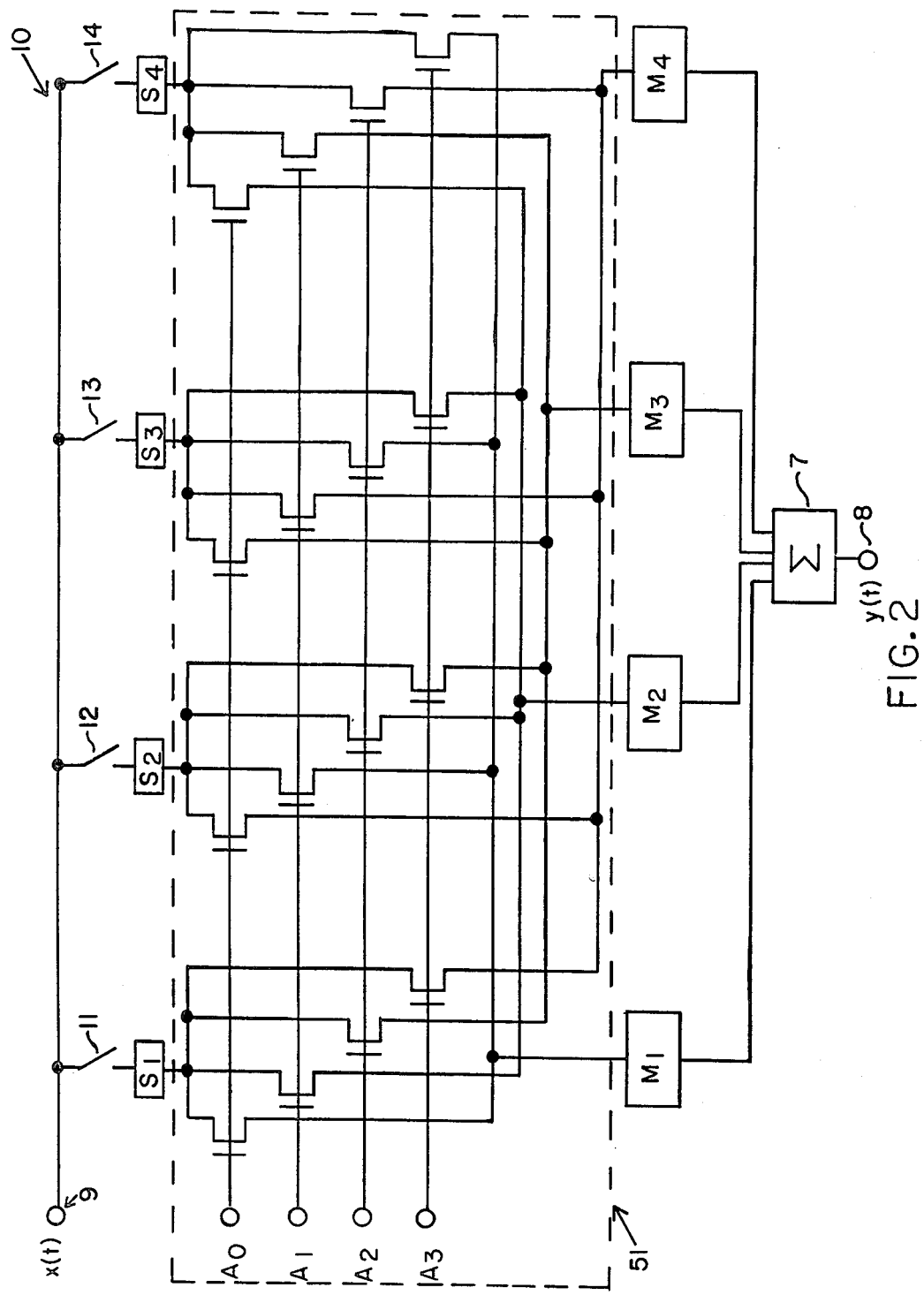
FIG. 2 is a schematic diagram of the transversal filter constructed in accordance with this invention.
Figure 4:
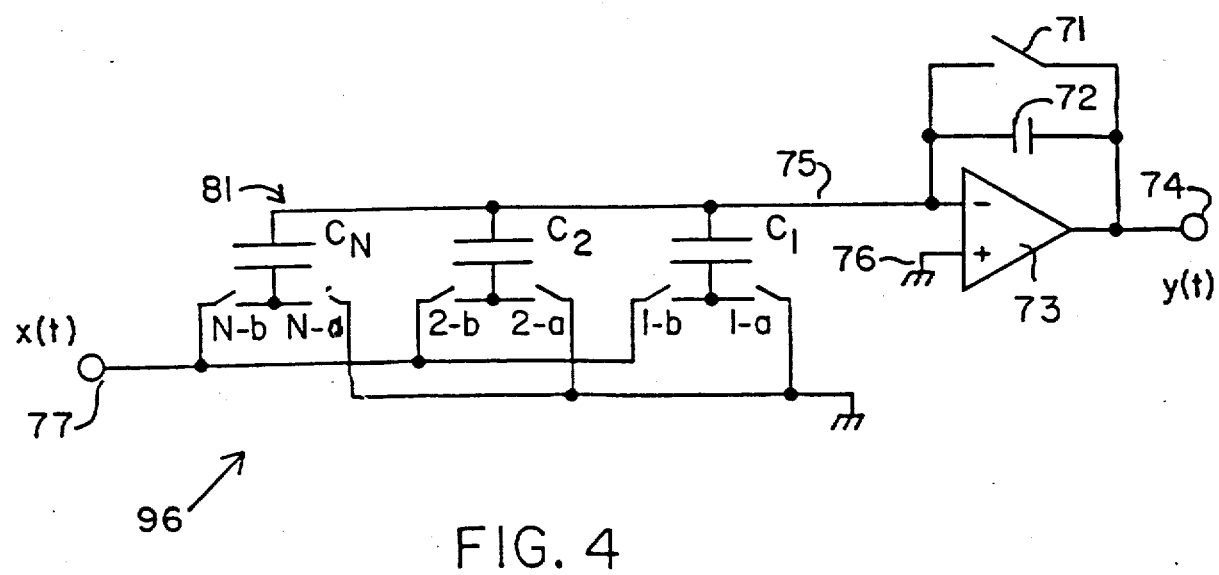

FIG. 2 shows a schematic diagram of a four stage transversal filter 10 constructed in accordance with this invention. In practice, the programmable transversal filters constructed in accordance with this invention will have a large number of stages, although the following discussion regarding the four stage filter of FIG. 2 will describe the operation of this invention.

An analog input signal X(t) is applied to input terminal 9 of transversal filter 10. Switches 11, 12, 13 and 14 selectively connect the input signal X(t) to one of the sample and hold circuits $S_1$ through $S_4$. The operation of switches 11 through 14 is timed to cause the switches 11 through 14 to operate in sequence, such that at time $t_1$, $X(t_1)$ is stored via closed switch 11 in sample and hold circuit $S_1$, at time $t_2$, analog signal $X(t_2)$ is stored via closed switch 12 in sample and hold circuit $S_2$, at time $t_3$ signal $X(t_3)$ is stored via closed switch 13 in sample and hold circuit $S_3$, and at time $t_4$ signal $X(t_4)$ is stored via closed switch 14 in sample and hold circuit $S_4$. In this manner, at any time t, analog signal X(t), X(t−1), X(t−2), and X(t−3) will be stored in sample and hold circuits $S_1$ through $S_4$, although the location of signal X(t) and the time delayed signals X(t−1), X(t−2) and X(t−3) within sample and hold circuits $S_1$ through $S_4$ will vary with time. This is depicted in Table I.

The operation of the programmable transversal filter 10 of FIG. 2 is as follows, and will be easily understood in conjunction with Table I. First, the tap weights (i.e., multiplying factors) are loaded into multiplying means $M_1$ through $M_4$ (having tap weights of $a_1$ through $a_4$, respectively) in a well-known manner which will be more fully described later. Then, at time $t_1$, switch 11 closes and switches 12, 13 and 14 are open, thus storing $x(t_1)$ in sample and hold circuit $S_1$. At time $t_2$, switch 12 closes and switches 11, 13 and 14 are open, thus storing $X(t_2)$ in sample and hold circuit $S_2$. At time $t_3$, switch 13 closes and switches 11, 12 and 14 are open, thus storing $X(t_3)$ in sample and hold circuit $S_3$. Similarly at time $t_4$, switch 14 closes and switches 11, 12 and 13 are open, thus storing $X(t_4)$ in sample and hold circuit $S_4$. At time $t_5$, switch 11 closes and $X(t_5)$ is stored in sample and hold circuit $S_1$, with the original signal $X(t_1)$ stored in sample and hold circuit $S_1$ being lost. Another way of looking at this storage technique, is that at time $t_5$, sample and hold circuit $S_1$ has stored $X(t_5)$, sample and hold circuit $S_4$ has stored $X(t_4)$, sample and hold circuit $S_3$ has stored $X(t_3)$, and sample and hold circuit $S_2$ has stored $X(t_2)$.

The operation of cross-point switch 51 is depicted in FIG. 2. The switches shown in analog cross-point switch 51 are shown as N channel metal oxide silicon (MOS) transistors, although any suitable switch means may be used. Utilizing N channel transistors, a high voltage (logical one) applied to the gate of the transistor causes it to conduct, while a low voltage (logical zero) applied to the gate causes it to turn off. A single logical one is applied to terminals $A_0$ through $A_3$ at any one time.

As shown in Table I, at time $t_1$ with a logical one applied to terminal $A_0$, and logical zeroes applies to terminals $A_1$ through $A_3$, sample and hold circuit $S_1$ is connected to multiplier $M_1$, sample and hold circuit $S_2$ is connected to multiplier $M_4$, sample and hold circuit $S_3$ is connected to multiplier $M_3$, and sample hold circuit $S_4$ is connected to multiplier $M_2$.

At time $t_2$, a logical one is applied to terminal $A_1$, with terminals $A_0$, $A_2$ and $A_3$ being held low (logical zero). Thus, sample and hold circuit $S_2$ is connected to multiplier $M_1$, sample and hold circuit $S_3$ is connected to multiplier $M_4$, sample and hold circuit $S_4$ is connected to multiplier $M_3$, and sample and hold circuit $S_1$ is connected to multiplier $M_2$. The address signals applied to terminals $A_0$ through $A_3$, and the resultant connections between sample and hold circuits $S_1$ through $S_4$ to multipliers $M_1$ through $M_4$, are shown in Table I for times $t_1$ through $t_4$.

Thus, as shown in Table I, the output voltage from multiplier $M_1$ during each time $t_1$ through $t_4$ is equal to $a_1X(t)$; the output voltage from multiplier $M_2$ is equal to $a_2X(t-1)$; the output voltage from multiplier $M_3$ is equal to $a_3X(t-2)$; and the output voltage from multiplier $M_4$ is equal to $a_4X(t-3)$. Thus, as shown in Table I, at all times $t_1$ through $t_4$ the output voltage y(t) from summing means 7 available on terminal 8 is equal to $$y(t) = a_1x(t) + a_2x(t-1) + a_3x(t-2) + a_4x(t-3) \quad (3)$$

which is the output voltage desired from a transversal filter.

Figure 1:
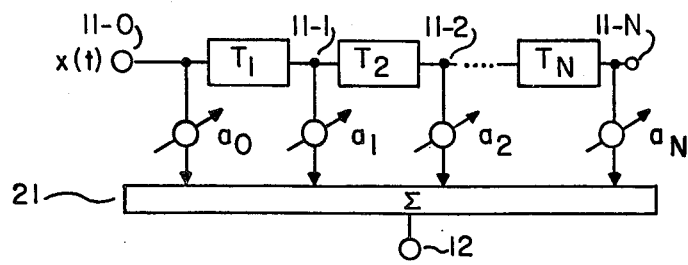
FIG. 1 is a block diagram of a typical transversal filter.
Figure 3:
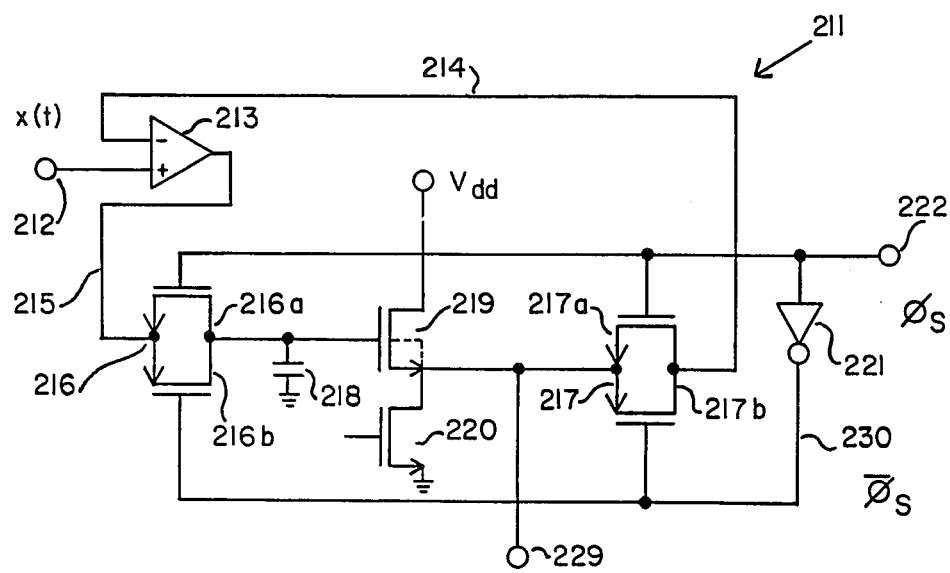
FIG. 3 is a schematic diagram of a sample and hold circuit utilized in the circuit shown in FIG. 2.

One sample and hold circuit which may be used for sample and hold circuits $S_1$ through $S_4$ of FIG. 2 is shown in the schematic diagram of FIG. 3. Sample and hold circuit 211 comprises input terminal 212 which is connected to the input voltage X(t) through switch 11 of FIG. 2, when sample and hold circuit 211 serves as sample and hold circuit $S_1$ (FIG. 2). Input terminal 212 of sample and hold circuit 211 is connected to the non-inverting input lead of operational amplifier 213. The output lead 215 of operational amplifier 213 is connected to transmission gate 216 comprising N channel MOSFET 216a and P channel MOSFET 216b. The state of transmission gate 216 (i.e., conducting or non-conducting) is controlled by sample and hold signal $\phi_s$ connected to terminal 222. Sample and hold signal $\phi_s$ is connected to the gate of N channel MOSFET 216a, and to inverter 221. Inverter 221 generates on its output lead 230 an inverted sample and hold signal $\phi_s$ which is connected to the gate of P channel MOSFET 216b. Thus, with high (positive) $\phi_s$ connected to terminal 222, transmission gate 216 conducts, and with a low $\phi_s$ transmission gate 216 turns off. In a similar manner, a second transmission gate 217 comprising N channel MOSFET 217a and P channel MOSFET 217b is controlled by sample and hold signal $\phi_s$.

During the sample phase, $\phi_s$ goes high, and transmission gates 216 and 217 conduct. The output voltage from operational amplifier 213 is connected through transmission gate 216 to capacitor 218, thus charging capacitor 218 to the output voltage $V_x$ of operational amplifier 213. This output voltage provides gate bias to N channel MOSFET 219, thus causing transistor 219 to turn on, thus providing a voltage $V_{out}$ on terminal 229. This voltage $V_{out}$ is also applied through transmission gate 217 to inverting input lead 214 of operational amplifier 213. Because the steady state voltages on the inverter input lead and on the noninverting input lead of an operational amplifier are equal, the voltage $V_{out}$ is equal to the input voltage $V_{in}$. In this manner, the output voltage $V_x$ generated on output lead 215 of operational amplifier 213 and stored on capacitor 218 has a magnitude sufficient to bias the gate of transistor 229 in such a fashion as to generate on output terminal 229 a voltage $V_{out}$ which is exactly equal to the sample input voltage $V_{in}$.

After a time period of approximately 3 microseconds required to achieve a steady state condition in sample and hold circuit 211 such that the output voltage $V_{out}$ on output terminal 219 is exactly equal to the sampled input voltage $V_{in}$, the sample signal $\phi_s$ goes low, thus turning off transmission gates 216 and 217. Thus, a voltage $V_x$ is stored on capacitor 218, which contains to bias the gate of transistor 219 so as to provide an output voltage $V_{out}$ on output terminal 229 which is exactly equal to the sampled input voltage $V_{in}$. Because transistor 219 is a metal oxide silicon (MOS) device, the gate bias provided by capacitor 218 requires virtually no current to be drawn from capacitor 218, thereby preventing the discharge of the voltage $V_x$ stored on capacitor 218. Thus, the voltage $V_x$ stored on capacitor 218 may be used to generate on output terminal 229 a voltage $V_{out}$ equal to sampled input voltage $V_{in}$ for long periods of time of the order of several milliseconds. The output voltage $V_{out}$ provided on output terminal 229 is not affected by the turning off of transmission gate 217 because the very high impedance of inverting lead 214 of operational amplifier 213 draws substantially no current from output terminal 229.

When it becomes necessary to sample and store a second input signal $V_{in}'$, sample and hold signal $\phi_s$ goes high, thus turning on transmission gates 216 and 217. A new voltage $V_x'$ is thus stored on capacitor 218, thereby generating a new voltage $V_{out}$ equal to $V_{in}'$ on output terminal 229.

Figure 4:
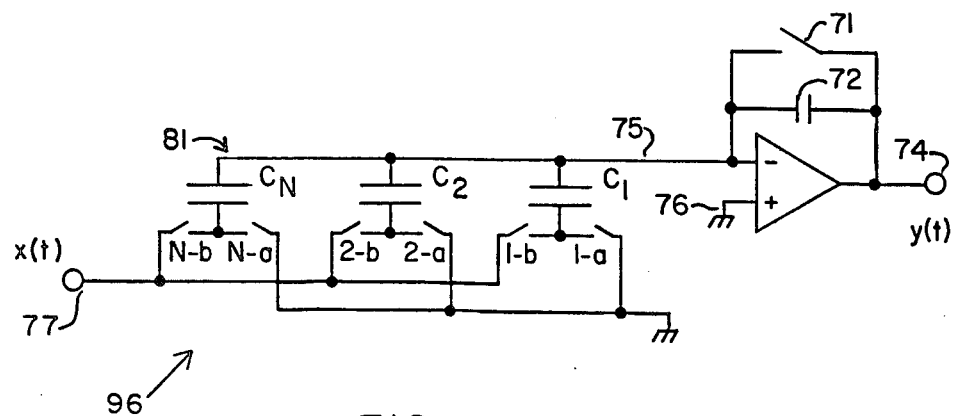
FIG. 4 is a schematic diagram of the multiplying means utilized in the transversal filter shown in FIG. 2.

One multiplying means which may be used for each multiplier $M_1$ through $M_4$ (FIG. 2) is shown in schematic diagram in FIG. 4. Multiplier 96 includes operational amplifier 73 having output terminal 74, noninverting input lead 76 connected to ground, and inverting input lead 75. Integrating capacitor 72, having a capacitance value $C_{72}$, is connected between inverting lead 75 and output terminal 74. Connected in parallel with capacitor 72 is switch 71, which serves to discharge capacitor 72. Capacitor array 81, comprising a plurality of N capacitors $C_1$ through $C_n$, is also utilized in the multiplier 96. One plate of each capacitor $C_1$ through $C_n$ is connected to the inverting input lead 75 of operational amplifier 73. The second plate of each capacitor $C_1$ through $C_n$ is connected to a pair of switches 1-a through N-a, and 1-b through N-b. The other terminal of switches 1-a through N-a is connected to ground, thus allowing the second plate of capacitors $C_1$ through $C_n$ to be selectively connected to ground. Similarly, the other terminal of switches 1-b through N-b is connected to input terminal 77 in order that the second plate of each capacitor $C_1$ through $C_n$ may be selectively connected to the analog input voltage $V_{in}$ to be multiplied by multiplier 96. Capacitors $C_1$ through $C_n$ may be of equal value, such that the effective capacitance of capacitor array 81 may range between 0 and NC, where N is the number of capacitors in capacitor array 81, and C is the capacitance value of each of the N capacitors.

Alternatively, the capacitors $C_1$ through $C_n$ of capacitor array 81 may be binary weighted, such that the capacitance value of each capacitor is defined as:

$$C_j = 2^{(j-1)}C \tag{4}$$

where
$C_j$ = the capacitance value of the jth capacitor,
j is a positive integer such that $0 \leq j \leq N$; and
$C_1$ is the capacitance value of capacitor $C_1$.

In this manner, by selectively operating switches 1-a through N-a and 1-b through N-b, the effective capacitance of capacitor array 81 is to equal to $$C_{81} = FC; \tag{5}$$

where
$C_{81}$ is the effective capacitance of capacitor array 81; and
F is an integer such that $0 \leq F \leq (2^N - 1)$, where N is the number of capacitors in capacitor array 81.

The operation of multiplier 96 of FIG. 4 is as follows. If the sign bit of the digital tap weight multiplying factor indicates that the tap weight is positive, switch 71 closes, thus discharging capacitor 72. Switches 1-a through N-a also close, thus discharging capacitors $C_1$ through $C_n$. Switch 71 then opens. Selected ones of switches 1-b through N-b then close, with the corresponding switches 1-a through N-a opening. For example, if switches 3-b and 7-b close, switches 3-a and 7-a open. The selection of which of switches 1-b through N-b will close is made such that the ratio of the effective capacitance of capacitor array 81 to the capacitance of capacitor 72 is equal to the desired multiplication factor, or tap weight. Thus, $$G_{76} = -(C_{81}/C_{72}) \tag{6}$$

where
$G_{76}$ = the closed loop gain of operational amplifier 76, and thus equal to the tap weight of multiplier 96.

The closing of selected switches 1-b through N-b charges the selected capacitors $C_1$ through $C_N$ to a voltage equal to $V_{in}$, thus integrating a charge equal to $C_{81}V_{in}$ on integration capacitor 72. This results in an output voltage $V_{out}$ on terminal 74 equal to $$V_{out} = -G_{76}V_{in}. \tag{7}$$

On the other hand, if the sign bit of the digital tap weight multiplying factor indicates that the tap weight is negative, switch 71 closes, thus discharging capacitor 72. Switches 1-b through N-b then close, thus charging capacitors $C_1$ through $C_N$ to $V_{in}$. Switch 71 then opens. Selected ones of switches 1-a through N-a then close, with the corresponding switches 1-b through N-6 opening. For example, if switches 3-a and 7-a close, switches 3-b and 7-b open.

The closing of selected switches 1-a through N-a discharges the selected capacitors $C_1$ through $C_N$, thus integrating a charge equal to $-C_{81}V_{in}$ on integration capacitor 72. This results in an output voltage $V_{out}$ on terminal 74 equal to $$V_{out} = G_{76}V_{in} \tag{8}$$

Thus, multiple 96 is capable of multiplying an analog input signal with a digital tap weight. The analog input signal and the digital tap weight may be either positive or negative.

The discussion in this specification is by way of example and is not to be construed as a limitation on the scope of this invention. Many alternate embodiments will become apparent to those skilled in the art in light of this disclosure.

TABLE I

| | Signal Stored in Sample and Hold Circuits | | | | Address Signals | | | |
|---|---|---|---|---|---|---|---|---|
| time | S1 | S2 | S3 | S4 | A3 | A2 | A1 | A0 |
| T1 | X(t) | X(t-3) | X(t-2) | X(t-1) | 0 | 0 | 0 | 1 |
| T2 | X(t-1) | X(t) | X(t-3) | X(t-2) | 0 | 0 | 1 | 0 |
| T3 | X(t-2) | X(t-1) | X(t) | X(t-3) | 0 | 1 | 0 | 0 |
| T4 | X(t-3) | X(t-2) | X(t-1) | X(t) | 1 | 0 | 0 | 0 |
| T1 | X(t) | X(t-3) | X(t-2) | X(t-1) | 0 | 0 | 0 | 1 |

| | Multiplier Connected to Sample and Hold Circuits | | | | Output Voltage from Multipliers | | | |
|---|---|---|---|---|---|---|---|---|
| time | S1 | S2 | S3 | S4 | M1 | M2 | M3 | M4 |
| T1 | M1 | M4 | M3 | M2 | a1X(t) | a2X(t-1) | a3X(t-1) | a4X(t-3) |
| T2 | M2 | M1 | M4 | M3 | a1(X(t) | a2X(t-1) | a3X(t-2) | a4X(t-3) |
| T3 | M3 | M2 | M1 | M4 | a1X(t) | a2X(t-1) | a3X(t-2) | a4X(t-3) |
| T4 | M4 | M3 | M2 | M1 | a1X(t) | a2X(t-1) | a3X(t-2) | a4X(t-3) |
| T1 | M1 | M4 | M3 | M2 | a1X(t) | a2X(t-1) | a3X(t-2) | a4X(t-3) |

| time | Output Voltage y(t) from Summing Means 7 |
|---|---|
| T1 | a1X(t) + a2X(t-1) + a3X(t-2) + a4X(t-3) |
| T2 | a1X(t) + a2X(t-1) + a3X(t-2) + a4X(t-3) |
| T3 | a1X(t) + a2X(t-1) + a3X(t-2) + a4X(t-3) |
| T4 | a1X(t) + a2X(t-1) + a3X(t-2) + a4X(t-3) |
| T1 | a1X(t) + a2X(t-1) + a3X(t-2) + a4X(t-3) |

I claim:

1. A programmable transversal filter comprising:
an input terminal for receiving an input signal to be filtered;
a first plurality of N sample and hold means, where N is a selected positive integer, each of said N sample and hold means having an output lead and having an input lead for direct connection to said input terminal;
a first plurality of N switch means for connecting a selected one of said sample and hold means to said input terminal such that said selected one of said sample and hold means receives said input signal to be filtered;
a first plurality of N multiplying means, each having an input lead and an output lead;
a summing means having a plurality of N input leads and an output lead;
a second plurality of N×N switch means forming a cross-point switch allowing said output lead of each said N sample and hold means to be uniquely connected to said input lead of a selected one of said N multiplying means;
first control means for sequentially closing a single one of said N switch means, thereby causing to be stored in said N sample and hold means a sampled input signal from N previous time instants;
second control means for operating said second plurality of N×N switch means such that said output lead of each of said N sample and hold means is uniquely connected to said input lead of a selected one of said N multiplying means; and
means for uniquely connecting said output lead of each of said N multiplying means to a selected one of said N input leads of said summing means;
whereby said input signal is filtered, providing a filtered output signal on said output terminal of said summing means.

2. Structure as in claim 1 wherein the sample and hold means containing the kth previous signal sample is connected to the kth multiplying means, where $1 < k < N$.

3. Structure as in claim 1 wherein said output signal is equal to $$y(t) = \sum_{j=0}^{N-1} a_j x(t - j)$$

where $y(t) =$ the output signal at time $t$;
$a_j =$ the multiplication factor of the $j$th multiplying means; and
$x(t - j) =$ the input signal at time $(t - j)$.

4. Structure as in claims 1, 2 or 3 wherein said first plurality of switch means and said second plurality of switch means are metal oxide silicon (MOS) devices.

5. Structure as in claims 1, 2 or 3 wherein each said sample and hold means comprises:
an operational amplifier having a noninverting input lead for receiving an input signal to be sampled, an inverting input lead, and an output lead;
a capacitor having a first plate connected to a reference voltage and having a second plate;
an amplifier means having an input lead connected to said second plate of said capacitor and also having an output lead;
first switch means for connecting said output lead of said operational amplifier to said second plate of said capacitor during sampling of said input signal;
second switch means for connecting said output lead of said amplifier means to said inverting input lead of said operational amplifier during sampling of said input signal; and
means for controlling said first switch means and said second switch means such that said first and second switch means are open during sampling of said input signal and said first and second switch means are closed during a holding period;
whereby said capacitor is charged during sampling to a value sufficient to generate on said output lead of said amplifier means a voltage equal to said input signal which had been sampled, whereby the charge on said capacitor, and thus the voltage on said output lead of said amplifier means, remains substantially constant during said holding period.

6. Structure as in claims 1, 2 or 3 wherein each of said multiplying means comprises:
an input terminal for receiving an input signal;
a plurality of P capacitors, each having a first and a second plate;
an operational amplifier having an inverting input lead connected to said first plate of each of said plurality of P capacitors, a noninverting input lead connected to a reference voltage, and an output lead;
an integrating capacitor connected between said inverting input lead and said output lead of said operational amplifier;
a plurality of P switch means, each associated with a unique one of said P capacitors and each allowing the connection of said second plate of its associated one of said P capacitors to either said reference voltage or said input terminal;

means responsive to the magnitude of a multiplying factor for causing selected ones of said P switch means to operate in response to the receipt of said input signal; and means responsive to the sign of a multiplying factor for selectively operating said selected ones of said plurality of P switch means such that said integrating capacitor integrates a charge equal to the positive of said input signal multiplied by the effective capacitance of those of said plurality of P capacitors associated with said selected ones of said P switch means when said sign of said multiplying factor is positive, and equal to the negative of said input signal multiplied by the effective capacitance of those of said plurality of P capacitors associated with said selected ones of said P switch means when said sign of said multiplying factor is negative, thereby providing an output signal on said output lead of said operational amplifier equal to said input signal multiplied by said multiplying factor.

* * * * *

UNITED STATES PATENT AND TRADEMARK OFFICE
CERTIFICATE OF CORRECTION

PATENT NO. : 4,470,126
DATED : September 4, 1984
INVENTOR(S) : Yusuf A. Haque

It is certified that error appears in the above—identified patent and that said Letters Patent is hereby corrected as shown below:

Figure 4 should appear as shown on the attached sheet.

Column 1, line 38: Insert a space between "$T_N$" and "are multiplied".

Column 1, line 65: Insert --in-- between "Baertsh et al." and "'The Design...'".

Column 3, line 56: Delete the comma that follows "storage".

UNITED STATES PATENT AND TRADEMARK OFFICE
CERTIFICATE OF CORRECTION

PATENT NO. : 4,470,126
DATED : September 4, 1984
INVENTOR(S) : Yusuf A. Haque

It is certified that error appears in the above—identified patent and that said Letters Patent is hereby corrected as shown below:

Column 4, line 4: Delete "applies" and insert --applied--.

Column 5, line 3: Delete "inverter" and insert --inverting--.

Column 6, line 56: Delete "N-6" and insert --N-b--.

Column 6, line 67: Delete "multiple" and insert --multiplier--.

UNITED STATES PATENT AND TRADEMARK OFFICE
CERTIFICATE OF CORRECTION

PATENT NO. : 4,470,126

DATED : September 4, 1984

INVENTOR(S) : Yusuf A. Haque

It is certified that error appears in the above—identified patent and that said Letters Patent is hereby corrected as shown below:

Column 7, second table: Delete first "(" in table position $T_1$, $M_2$.

Column 7, second table: Delete first "(" in table position $T_1$, $M_1$.

Signed and Sealed this

Sixteenth Day of July 1985

[SEAL]

Attest:

DONALD J. QUIGG

Attesting Officer    Acting Commissioner of Patents and Trademarks